US011362158B2

(12) United States Patent
Yang

(10) Patent No.: US 11,362,158 B2
(45) Date of Patent: Jun. 14, 2022

(54) ORGANIC LIGHT-EMITTING DIODE DISPLAY DEVICE

(71) Applicant: Wuhan China Star Optoelectronics Semiconductor Display Technology Co., Ltd., Wuhan (CN)

(72) Inventor: Hanning Yang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 199 days.

(21) Appl. No.: 16/759,740

(22) PCT Filed: Mar. 17, 2020

(86) PCT No.: PCT/CN2020/079700
§ 371 (c)(1),
(2) Date: Apr. 28, 2020

(87) PCT Pub. No.: WO2021/120428
PCT Pub. Date: Jun. 24, 2021

(65) Prior Publication Data
US 2021/0408185 A1 Dec. 30, 2021

(30) Foreign Application Priority Data

Dec. 17, 2019 (CN) .......................... 201911298179.2

(51) Int. Cl.
*H01L 27/32* (2006.01)
*H01L 51/00* (2006.01)
*H01L 51/52* (2006.01)

(52) U.S. Cl.
CPC ...... *H01L 27/3248* (2013.01); *H01L 27/3234* (2013.01); *H01L 27/3246* (2013.01); *H01L 51/0097* (2013.01); *H01L 51/5253* (2013.01); *H01L 27/3211* (2013.01);
(Continued)

(58) Field of Classification Search
CPC ............ H01L 27/3248; H01L 27/3234; H01L 27/3246; H01L 27/3211; H01L 27/3295; H01L 27/3274; H01L 51/0097; H01L 51/5253; H01L 2251/301
See application file for complete search history.

(56) References Cited

U.S. PATENT DOCUMENTS 7,696,519 B2 * 4/2010 Miyazawa .......... H01L 27/3246
257/72
9,069,208 B2 * 6/2015 Shinkai ............. G02F 1/133615
11,152,587 B2 * 10/2021 Chang ................... H01L 27/322
(Continued)

*Primary Examiner* — Ida M Soward

(57) ABSTRACT

An organic light-emitting diode display device is provided, which includes a base layer, a device layer, a pixel layer, an encapsulation layer, and a camera, wherein the camera is disposed on a back side of the base layer, and the pixel layer includes an anode layer, a pixel definition layer, and a cathode layer. A nanopore array is provided in a region of the anode layer corresponding to the camera, and the nanopore array is configured to allow external light to be transmitted to the camera through the anode layer to implement camera function of the camera. Selective transmission of light can be achieved by adjusting size of nanopores in the nanopore array, so that the display device positioned above the camera can display a picture normally, which is beneficial to achieving a full-screen display.

20 Claims, 3 Drawing Sheets

(52) U.S. Cl.
CPC .... *H01L 27/3274* (2013.01); *H01L 2251/301* (2013.01); *H01L 2251/5338* (2013.01)

(56) References Cited

U.S. PATENT DOCUMENTS

| | | | | |
|---|---|---|---|---|
| 2001/0008742 | A1* | 7/2001 | Jen | H01L 28/92 |
| | | | | 430/311 |
| 2014/0077196 | A1* | 3/2014 | Shim | H01L 27/3246 |
| | | | | 349/59 |
| 2015/0171379 | A1* | 6/2015 | Min | H01L 51/5092 |
| | | | | 438/34 |
| 2018/0114823 | A1* | 4/2018 | Lee | G09G 3/3291 |
| 2018/0299603 | A1* | 10/2018 | Lee | G02B 5/3016 |
| 2019/0157586 | A1* | 5/2019 | Liu | H01L 51/56 |
| 2019/0198587 | A1* | 6/2019 | Park | H01L 51/5253 |
| 2020/0075825 | A1* | 3/2020 | Sugitani | H01L 33/0093 |
| 2020/0365819 | A1* | 11/2020 | Seo | H01L 51/5016 |

* cited by examiner

ORGANIC LIGHT-EMITTING DIODE DISPLAY DEVICE

RELATED APPLICATIONS

This application is a National Phase of PCT Patent Application No. PCT/CN2020/079700 having International filing date of Mar. 17, 2020, which claims the benefit of priority of Chinese Patent Application No. 201911298179.2 filed on Dec. 17, 2019. The contents of the above applications are all incorporated by reference as if fully set forth herein in their entirety.

FIELD AND BACKGROUND OF THE INVENTION

The present application relates to the field of display technologies, and in particular, to an organic light-emitting diode display device.

Organic light-emitting diode (OLED) display devices have many advantages such as self-luminosity, low driving voltage, high luminous efficiency, fast response times, high definition and contrast ratio, wide viewing angles, flexible display, and large-area full-color display, and are recognized by the industry as the most promising display devices.

In the field of display technologies, full-screen display technology has gradually become a focus of development by major panel manufacturers. However, full-screen design of OLED display devices has many problems in actual production. For example, in display devices that include front-end devices such as front cameras and photosensitive sensors, such as mobile phones and tablets, a problem of spatial occupation of the front-end devices makes the full-screen truly unrealizable.

As shown in FIG. 1, an OLED display device in conventional art generally includes a base layer 11, a device layer 12, and a pixel layer 13. The pixel layer 13 includes an anode layer 131, a pixel definition layer 132, and a cathode layer 133. The anode layer 131 includes an opaque metal layer having a reflection function, and is configured to reflect light emitted from the pixel definition layer 132 to a light-emitting surface of the OLED display device. The front-end device such as a camera 15 is disposed on a back side of the base layer 11. Due to opaque nature of the anode layer 131, the front-end device such as the camera 15 cannot receive external light. In conventional art, in order to solve the above-mentioned problem, a method of digging a display panel on an upper layer of the front-end device such as the camera 15 is adopted, but this method causes a normal display region of the display panel to be reduced, which is not conducive to achieving full-screen display.

Therefore, it is necessary to improve current technology to ensure full-screen display while satisfying working requirements of front-end devices such as the camera under a screen.

Technical Problem

An OLED display device in conventional art, a anode layer is made of opaque metal, so that a front-end device such as a camera disposed under the anode layer cannot receive external light, and digging a display panel of the front-end device such as the camera will cause a normal display region of the display panel to be reduced, which is not conducive to achieve full-screen display.

SUMMARY OF THE INVENTION

Technical Solutions

In order to solve the above technical problems, solutions provided by the present application are as follows.

The present application provides an organic light-emitting diode display device, including:
a base layer;
a device layer disposed on the base layer;
a pixel layer disposed on the device layer, wherein the pixel layer includes an anode layer, a pixel definition layer disposed on the anode layer, and a cathode layer disposed on the pixel definition layer;
an encapsulation layer disposed on the pixel layer; and
a camera disposed on a side of the base layer away from the device layer;
wherein a nanopore array is provided in a region of the anode layer corresponding to the camera, and the nanopore array is configured to allow external light to be transmitted to the camera through the anode layer to implement camera function of the camera.

In an embodiment of the organic light-emitting diode display device according to the present application, an organic layer is disposed between the pixel layer and the device layer.

In an embodiment of the organic light-emitting diode display device according to the present application, the anode layer is embedded in the organic layer.

In an embodiment of the organic light-emitting diode display device according to the present application, a plurality of nanopores in the nanopore array are filled with a material of the organic layer.

In an embodiment of the organic light-emitting diode display device according to the present application, a diameter of one of a plurality of nanopores in the nanopore array ranges from 10 to 200 nanometers.

In an embodiment of the organic light-emitting diode display device according to the present application, a plurality of nanopores in the nanopore array are filled with a transparent material.

In an embodiment of the organic light-emitting diode display device according to the present application, the pixel definition layer is provided with a plurality of openings, the openings are provided with a light-emitting layer including a plurality of pixel colors, and the nanopore array corresponding to the light-emitting layer allows light with a color other than the pixel color of the light-emitting layer to pass through.

In an embodiment of the organic light-emitting diode display device according to the present application, a diameter of any one of a plurality of nanopores in the nanopore array corresponding to the light-emitting layer with a same pixel color is same.

In an embodiment of the organic light-emitting diode display device according to the present application, a diameter of any one of a plurality of nanopores in the nanopore array corresponding to the light-emitting layer with a different pixel color is different.

In an embodiment of the organic light-emitting diode display device according to the present application, the light-emitting layer includes three pixel colors of red, green, and blue, the nanopore array corresponding to the light-emitting layer of the red pixel color allows green light and/or blue light to pass through, the nanopore array corresponding to the light-emitting layer of the green pixel color allows red light and/or blue light to pass through, and the nanopore array corresponding to the light-emitting layer of the blue pixel color allows red light and/or green light to pass through.

In an embodiment of the organic light-emitting diode display device according to the present application, the pixel definition layer includes a plurality of first pixel points, the camera includes a plurality of second pixel points, one of the first pixel points and one of the corresponding second pixel points are respectively defined as a first vertical pixel point and a second vertical pixel point, and a pixel color of the first vertical pixel point is same as a pixel color of the second vertical pixel point.

In an embodiment of the organic light-emitting diode display device according to the present application, an absolute value of a difference between a wavelength of light corresponding to the first vertical pixel point and a wavelength of light corresponding to the second vertical pixel point ranges from 30 nm to 60 nm.

In an embodiment of the organic light-emitting diode display device according to the present application, the nanopore array corresponding to the second vertical pixel point allows light corresponding to the second vertical pixel point to pass through, but does not allow light corresponding to the first vertical pixel point to pass through.

In an embodiment of the organic light-emitting diode display device according to the present application, the pixel definition layer includes a plurality of first pixel points, the camera includes a plurality of second pixel points, one of the first pixel points and one of the corresponding second pixel points are respectively defined as a first vertical pixel point and a second vertical pixel point, and a pixel color of the first vertical pixel point is different from a pixel color of the second vertical pixel point.

In an embodiment of the organic light-emitting diode display device according to the present application, the nanopore array corresponding to the second vertical pixel point allows light with a same pixel color as the second vertical pixel point to pass through, but does not allow light with a same pixel color as the first vertical pixel point to pass through.

In an embodiment of the organic light-emitting diode display device according to the present application, diameters of a plurality of nanopores in the nanopore array are not completely same, and the nanopores with different diameters transmit light with different colors.

In an embodiment of the organic light-emitting diode display device according to the present application, a shape of a plurality of nanopores in the nanopore array is circular, oval, rectangular, diamond, or triangular.

In an embodiment of the organic light-emitting diode display device according to the present application, the base layer is made of a flexible transparent material, and the device layer includes an electronic component consisting of a plurality of thin film transistors and metal wires electrically connected to the thin film transistors.

In an embodiment of the organic light-emitting diode display device according to the present application, the cathode layer and the encapsulation layer are both transparent structures, and a support pad is disposed between the pixel layer and the encapsulation layer.

The present application further provides an organic light-emitting diode display device, including:
  a base layer;
  a device layer disposed on the base layer;
  a pixel layer disposed on the device layer, wherein the pixel layer includes an anode layer, a pixel definition layer disposed on the anode layer, and a cathode layer disposed on the pixel definition layer;
  an encapsulation layer disposed on the pixel layer; and
  a camera disposed on a side of the base layer away from the device layer;
  wherein a nanopore array is provided in a region of the anode layer corresponding to the camera, and the nanopore array is configured to allow external light to be transmitted to the camera through the anode layer to implement camera function of the camera;
  wherein a diameter of one of a plurality of nanopores in the nanopore array ranges from 10 to 200 nanometers;
  wherein the pixel definition layer is provided with a light-emitting layer including a plurality of pixel colors, and the nanopore array corresponding to the light-emitting layer allows light with a color other than the pixel color of the light-emitting layer to pass through; and
  wherein the diameter of any one of the nanopores in the nanopore array corresponding to the light-emitting layer with a same pixel color is same, and the diameter of any one of the nanopores in the nanopore array corresponding to the light-emitting layer with a different pixel color is different.

Beneficial Effect

The organic light-emitting diode display device provided by the present application has a nanopore array provided in the anode layer corresponding to the camera, so that the anode layer has good transmittance to meet imaging requirements of the camera. In addition, by adjusting the size of the nanopores in the nanopore array, selective transmission of light is achieved, so that the display device positioned above the camera can display pictures normally, which is conducive to achieving a full-screen display of the display device.

BRIEF DESCRIPTION OF THE SEVERAL VIEWS OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DESCRIPTION OF SPECIFIC EMBODIMENTS OF THE INVENTION

Figure 1:
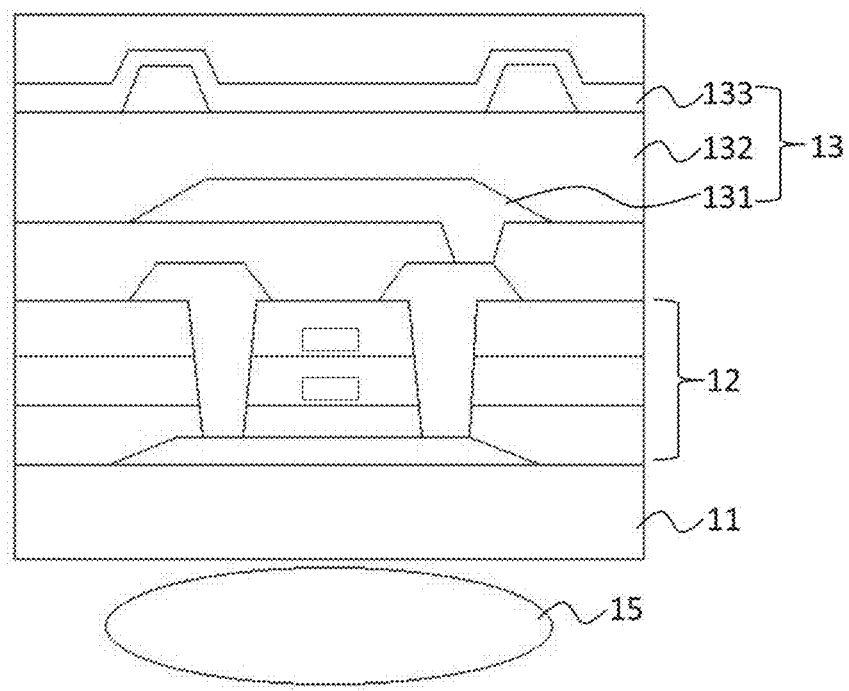
FIG. 1 is a schematic structural diagram of an organic light-emitting diode display device in conventional art.

The following description of each embodiment, with reference to the accompanying drawings, is used to exemplify specific embodiments which may be carried out in the present application. Directional terms mentioned in the present application, such as "top", "bottom", "front", "back", "left", "right", "inside", "outside", "side", etc., are only used with reference to the orientation of the accompanying drawings. Therefore, the used directional terms are intended to illustrate, but not to limit, the present application. In the drawings, components having similar structures are denoted by the same numerals.

An embodiment of the present application provides an organic light-emitting diode display device, including a camera and a display device disposed on the camera. In order to meet a requirement of capturing images by the camera, a nanopore array provided in an anode layer of the display device is provided in the embodiment of the present application, so that external light can be radiated toward the camera through the nanopore array, and the display device positioned on the camera can normally display a picture and realize a full-screen display.

Figure 2:
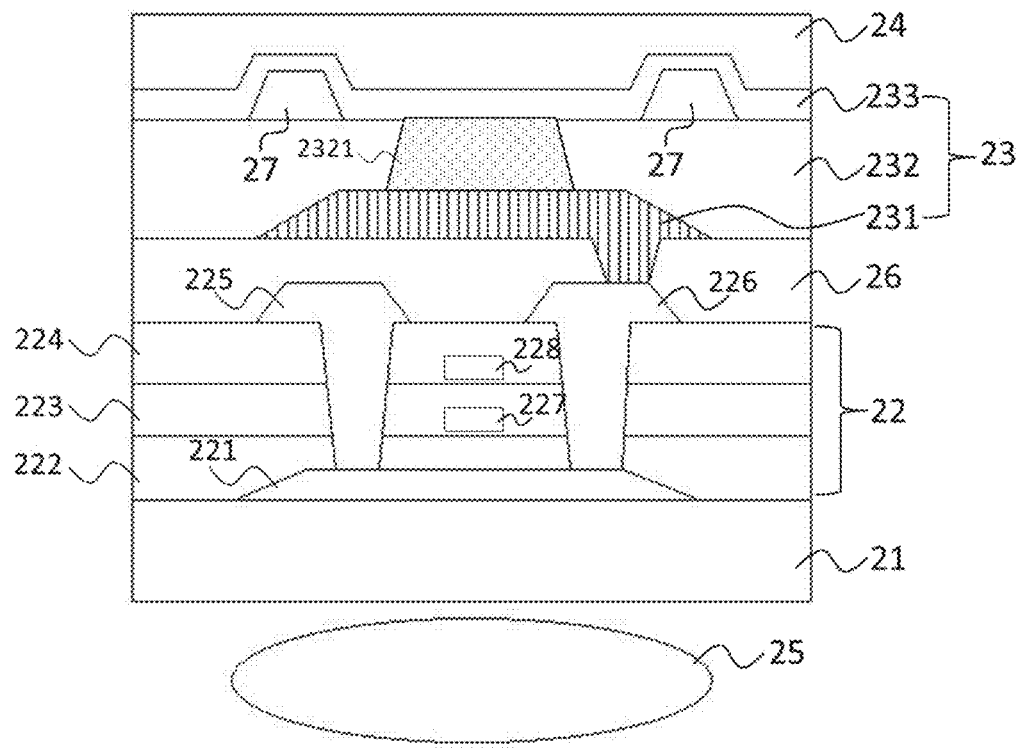
FIG. 2 is a schematic structural diagram of an organic light-emitting diode display device according to an embodiment of the present application.

As shown in FIG. 2, it is a schematic structural diagram of an organic light-emitting diode display device according to an embodiment of the present application. The organic light-emitting diode display device includes a base layer 21, a device layer 22 disposed on the base layer 21, a pixel layer 23 disposed on the device layer 22, an encapsulation layer 24 disposed on the pixel layer 23, and a camera 25 disposed on a side of the base layer 21 facing away from the device layer 22.

Optionally, the base layer 21 can be a flexible transparent substrate. For example, the base layer 21 can be made of polyimide, so that the organic light-emitting diode display device can implement flexible display or curved display.

Optionally, the device layer 22 includes an electronic component consisted of a plurality of thin film transistors and metal wires electrically connected to the thin film transistors. Specifically, the device layer 22 includes an active layer 221, a first gate insulation layer 222, a first gate 227, a second gate insulation layer 223, a second gate 228, an intermediate insulation layer 224, and a source 225 and a drain 226 electrically connected to opposite ends of the active layer 221, respectively. The active layer 222 is directly disposed on the base layer 21, the first gate insulation layer 222 is disposed on the base layer 21 and covers the active layer 221, the first gate 227 is disposed on the first gate insulation layer 222, the second gate insulation layer 223 is disposed on the first gate insulation layer 222 and covers the first gate 227, the intermediate insulation layer 224 is disposed on the second gate insulation layer 223 and covers the second gate 228, and the source 225 and the drain 226 are electrically connected to the opposite ends of the active layer 221 through hole structures on the intermediate insulation layer 224, the second gate insulation layer 223, and the first gate insulation layer 222, respectively. Optionally, the first gate 227 and the second gate 228 are electrically connected to external scanning signal lines, and are used to control an on-off state between the source 225 and the drain 226. The source 225 is electrically connected to an external data signal line, and is used to transmit a data signal to the drain 226 through the active layer 221. It should be noted that, a thin film transistor having a double-layer gate structure is provided in the present embodiment, but it is not limited thereto. In actual production, a thin film transistor having a single-layer gate or a multi-layer gate structure can be provided as required.

Optionally, an organic layer 26 is disposed on the intermediate insulation layer 224, and the organic layer 26 covers the intermediate insulation layer 224, the source 225, and the drain 226. The organic layer 26 has a flat upper surface to facilitate placement of the pixel layer 23 on the organic layer 26. The organic layer 26 plays a role of insulation and support.

Optionally, the pixel layer 23 is disposed on the organic layer 26. The pixel layer 23 includes an anode layer 231 disposed on the organic layer 26, a pixel definition layer 232 disposed on the anode layer 231, and a cathode layer 233 disposed on the pixel definition layer 232. The anode layer 231 is electrically connected to the drain 226 through a hole structure on the organic layer 26 to receive a signal transmitted on the drain 226. The pixel definition layer 232 is provided with a plurality of openings, the openings are provided with a light-emitting layer 2321 including a plurality of pixel colors. Optionally, the pixel colors of the light-emitting layer 2321 are three colors of red, green, and blue, and can emit light with three colors of red, green, and blue, respectively, thereby forming a red pixel unit, a green pixel unit, and a blue pixel unit. The cathode layer 233 is disposed on the pixel definition layer 232, and the cathode layer 233 is a transparent structure. The pixel definition layer 232 emits light under activity of electrical signals of the anode layer 231 and the cathode layer 233, so that the organic light-emitting display device displays a picture.

Specifically, the anode layer 231 is made of an opaque metal, and the opaque metal can be a precious metal such as gold or silver. The anode layer 231 includes a region corresponding to the camera 25 and other regions, a nanopore array is provided in the anode layer 231 corresponding the camera 25, and the nanopore array is configured to make external light radiated toward the camera 25 through the anode layer 231 to implement camera function of the camera 25. Optionally, a plurality of nanopores in the nanopore array are filled with transparent materials, a diameter of one of the nanopores in the nanopore array ranges from 10 to 200 nanometers (nm), and a shape of the nanopores in the nanopore array can be circular, oval, rectangular, diamond, or triangular. It should be noted that when the shape of the nanopores is circular, the diameter of the nanopores is a circular diameter, and when the shape of the nanopores is other than circular, the diameter of one of the nanopores refers to a maximum value of a distance between any two points in a nanopore.

It should be noted that the nanopore array provided in the anode layer 231 does not affect normal function of the anode layer 231, and therefore, a display region of the display device corresponding to the camera 25 can be displayed normally.

In addition, it should be noted that a region corresponding to the anode layer 231 and the camera 25 according to the embodiment of the present application refers to a vertical projection region of the camera 25 on the anode layer 231.

Optionally, an encapsulation layer 24 is disposed on the cathode layer 233, and the encapsulation layer 24 is made of a transparent material.

Optionally, a support pad 27 is further disposed between the pixel layer 23 and the encapsulation layer 24. The support pad 27 is used to support the encapsulation layer 24 to separate the encapsulation layer 24 and the pixel layer 23.

Figure 3:
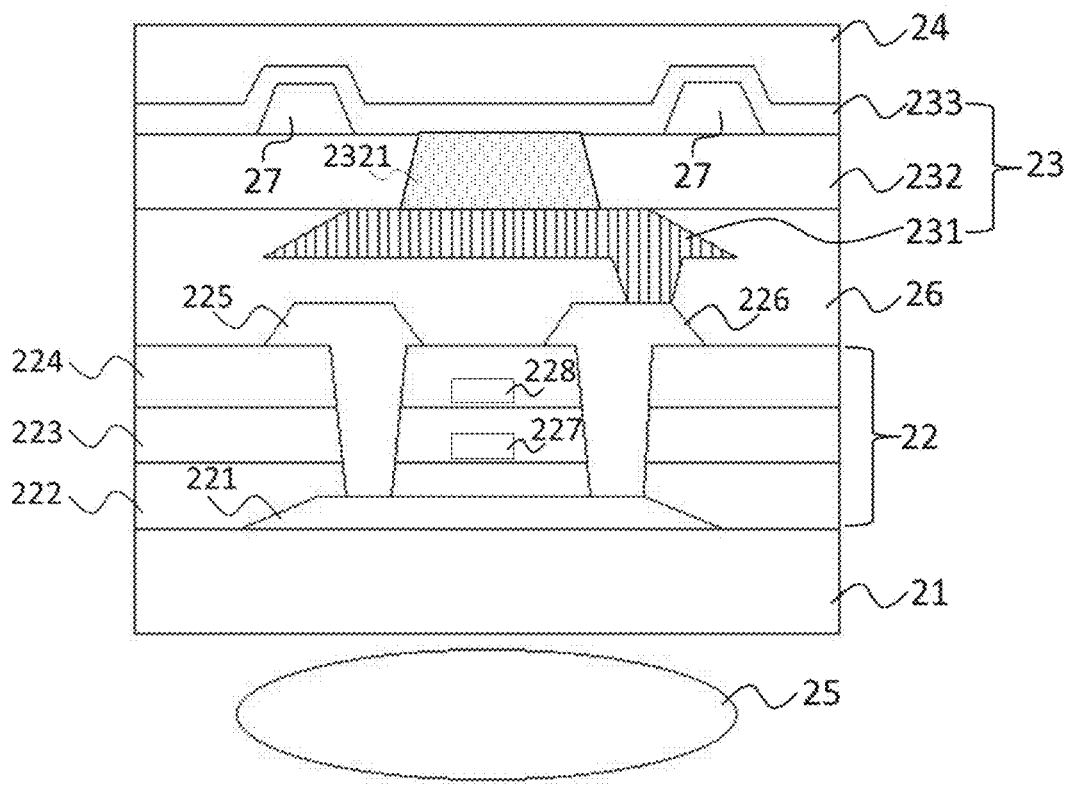
FIG. 3 is a schematic structural diagram of an organic light-emitting diode display device according to another embodiment of the present application.

According to an embodiment of the present application, as shown in FIG. 3, the anode layer 231 is embedded in the organic layer 26, and the nanopores in the nanopore array on the anode layer 231 are filled with material of the organic layer 231. It should be understood that, by embedding the anode layer 231 in the organic layer 26, a thickness of a region on the organic layer 26 corresponding to the camera 25 can be reduced, thereby further improving light passing ability of the region, which is beneficial for the camera 25 to perform capturing images.

According to an embodiment of the present application, as shown in FIG. 2, the light-emitting layer 2321 includes a plurality of pixel points, each of which has a pixel color, in other words, each of the pixel points can emit a color of light, and the color is the pixel color of the pixel point. The nanopore array in the anode layer 231 has selective transmission of light, and the specific properties are as follows. The pixel points corresponding to the nanopore array are set as vertical pixel points. The nanopore array can prevent light with a same color as the pixel color of the vertical pixel points from passing through the anode layer 231, while allowing light with a color different from the pixel color of the vertical pixel points to pass through the anode layer 231. It should be understood that selective transmission of light of the nanopore array in the anode layer 231 can achieve following effects: a reflection effect on light emitted from the pixel points in the light-emitting layer 2321 to realize normal display of the display device; meanwhile, external light is allowed to be emitted to the camera 25 through the nanopore array in the anode layer 231 to implement camera function of the camera.

Specifically, the light-emitting layer 2321 includes three pixel colors of red, green, and blue, wherein the nanopore array in the anode layer 231 corresponding to the red pixel color allows green light and/or blue light to pass through, the nanopore array in the anode layer 231 corresponding to the green pixel color allows red light and/or blue light to pass through, and the nanopore array in the anode layer 231 corresponding to the blue pixel color allows red light and/or green light to pass through.

It should be noted that "A" and "B" described in the embodiments of the present application refer to: a vertical projection of "A" on "B" falls within a range of "B", or a vertical projection of "B" on "A" falls within a range of "A". Meanwhile, "A" and "B" refer to specific elements described in the above embodiments, for example, "A" can be a nanopore array, and "B" can be a pixel point.

In addition, in the embodiments of the present application, the light-emitting layer 2321 is disposed in the pixel definition layer 232. Therefore, each pixel point and pixel color in the pixel definition layer 232 are the pixel points and the pixel colors of the light-emitting layer 2321.

Figure 4:
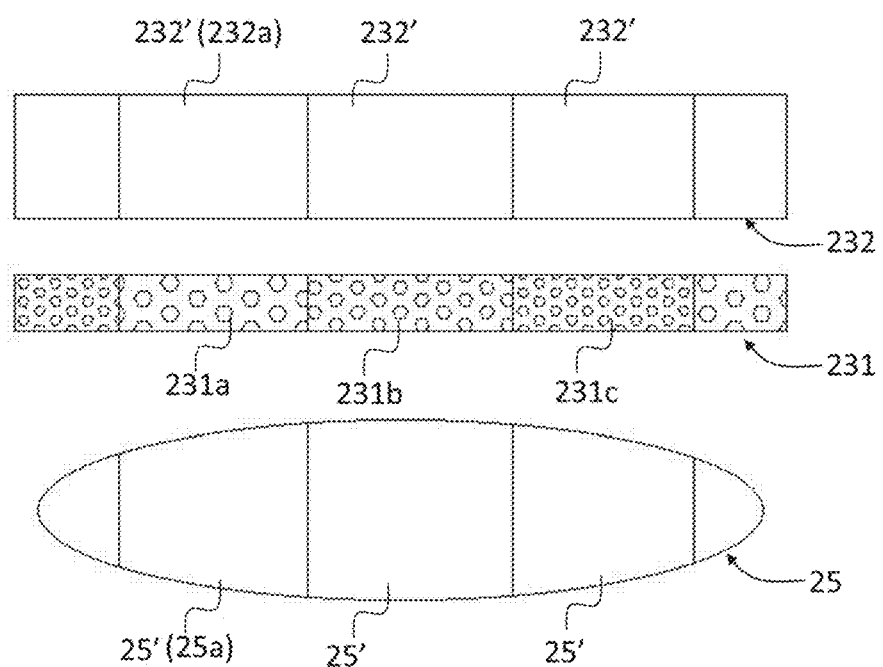
FIG. 4 is a schematic diagram of a correspondence relationship among a camera, an anode layer, and a pixel definition layer in the organic light-emitting diode display device shown in FIG. 2 or FIG. 3.

According to an embodiment of the present application, as shown in FIGS. 2 and 4, the pixel definition layer 232 includes a plurality of first pixel points 232', and the camera 25 includes a plurality of second pixel points 25'. The first pixel points 232' and the second pixel points 25' correspond to each other, or a part of the first pixel points 232' and a part of the second pixel points 25' correspond to each other. One of the first pixel points 232' and one of the corresponding second pixel points 25' are respectively defined as a first vertical pixel point and a second vertical pixel point. For example, the first pixel point 232a and the second vertical pixel point 25a shown in FIG. 4 correspond to each other, so the first pixel point 232a is defined as the first vertical pixel point, and the second pixel point 25a is defined as the second vertical pixel point.

When the first vertical pixel point 232a and the second vertical pixel point 25a have a same pixel color, that is, a color of light emitted from the first vertical pixel point 232a and a color need to be accepted of the second vertical pixel point 25a are same. In this case, an absolute value of a difference between a wavelength of light corresponding to the first vertical pixel point 232a and a wavelength of light corresponding to the second vertical pixel point 25a must range from 30 nm to 60 nm. Moreover, the nanopore array 231a corresponding to the second vertical pixel point 25a allows light corresponding to the second vertical pixel point 25a to pass through, but does not allow light corresponding to the first vertical pixel point 232a to pass through. For example, the pixel color of the first vertical pixel point 232a is red and the pixel color of the second vertical pixel point 25a is also red, and the absolute value of the difference between the wavelength of the red light corresponding to the pixel color of the first vertical pixel 232a and the wavelength of the red light corresponding to the pixel color of the second vertical pixel 25a ranges from 30 nm to 60 nm. The nanopore array 231a allows red light corresponding to the pixel color of the second vertical pixel 25a to pass through, but does not allow red light corresponding to the pixel color of the first vertical pixel 232a to pass through. It should be noted that the "light corresponding to the first vertical pixel point 232a" in the present embodiment refers to the light emitted from the first vertical pixel point 232a; the "light corresponding to the second vertical pixel 25a" refers to the light that the second vertical pixel 25a needs to receive.

When the first vertical pixel point 232a and the second vertical pixel point 25a have different pixel colors, the color of the light emitted from the first vertical pixel 232a is different from the color of the light to be received by the second vertical pixel 25a. At this time, the nanopore array 231a corresponding to the second vertical pixel point 25a allows the light with a same color as the pixel color of the second vertical pixel point 25a to pass through, but does not allow the light with a same color as the pixel color of the first vertical pixel point 232a to pass through. For example, the pixel color of the first vertical pixel point 232a is red, the pixel color of the second vertical pixel point 25a is green, and the nanopore array 231a allows green light to pass, but not red light.

It should be noted that the diameters of the nanopores in the nanopore array described in the embodiments of the present application are not completely same, so that different colors of light can be passed in different regions of the nanopore array. For example, as shown in FIG. 4, the diameter of one of the nanopores in the nanopore array 231a, the diameter of one of the nanopores in the nanopore array 231b, and the diameter of one of the nanopores in the nanopore array 231c are different. Therefore, the nanopore array 231a, the nanopore array 231b, and the nanopore array 231c respectively transmit light with different colors, thereby realizing selective transmission of light by the nanopore array.

Figure 5:
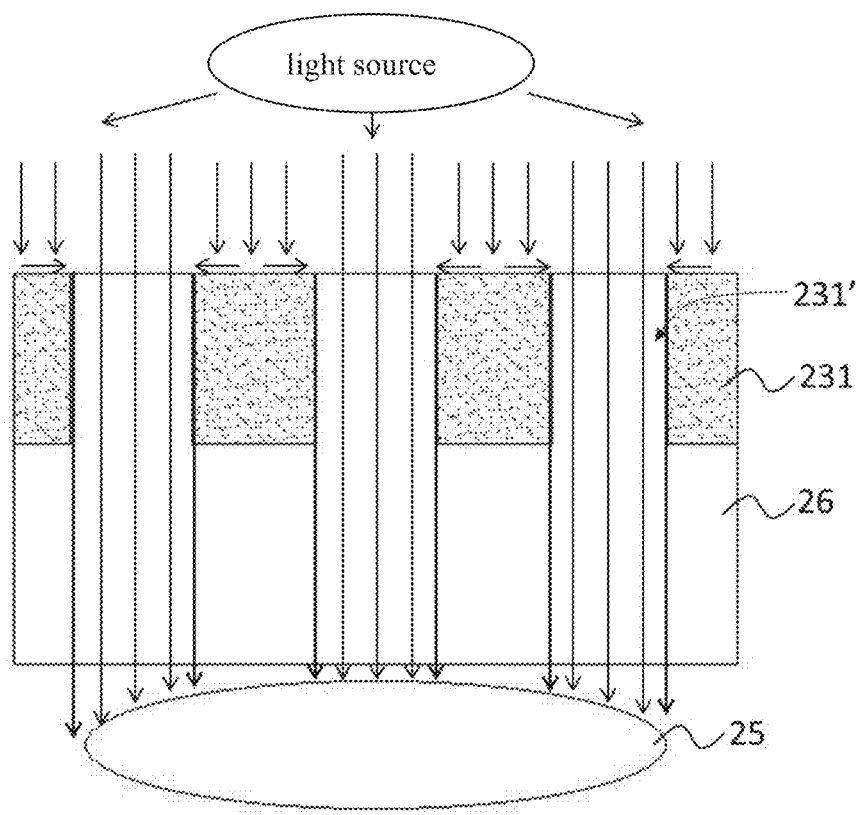
FIG. 5 is a schematic diagram of light transmittance of a nanopore array in the anode layer in the organic light-emitting diode display device according to an embodiment of the present application.

Transmission principle of the nanopore array and its selective transmission of light are analyzed as follows. As shown in FIG. 5, when light emitted from an external light source is irradiated to a surface of the anode layer 231, since the anode layer 231 includes a nanopore array, a part of light irradiated toward the camera 25 passes through the nanopores 231' in the nanopore array, and another part of light will illuminate a metal surface of the anode layer 231. Since a thickness of the anode layer 231 and the diameter of one of the nanopores 231' are both in a nanometer grade, the light irradiated on the metal surface of the anode layer 231 will coherently oscillate with free electrons in a metal of the anode layer 231, then, an electromagnetic wave is formed on the surface of the anode layer 231. The electromagnetic wave propagates downward along a surface of the nanopores 231', and in a form of light directed toward the camera 25 after passing through the nanopores 231', thereby achieving high transmission of light in a region of the anode layer 231 having a nanopore array. In addition, since the diameter of the nanopores 231' is at the nanometer grade, the wavelength of light that can pass through the nanopores 231' and can form an electromagnetic wave on the surface of the anode 231 is strictly limited. Only light with a specific wavelength can be transmitted to the camera 25 through the nanopores 231', and form an electromagnetic wave on the surface of the anode layer 231. Therefore, the selective transmission of light with different colors and different wavelengths can be achieved by adjusting the diameter of the nanopores 231'.

In summary, the organic light-emitting diode display device provided in the embodiments of the present application realizes the light transmittance of the anode layer by setting a nanopore array on the anode layer corresponding to the camera, so as to meet imaging requirements of the camera. In addition, the selective transmission of light can be achieved by adjusting size of the nanopores in the nanopore array, so that the display device positioned above the camera can display a picture normally, which is beneficial to achieving a full-screen display.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An organic light-emitting diode display device, comprising:
    a base layer;
    a device layer disposed on the base layer;
    a pixel layer disposed on the device layer, wherein the pixel layer comprises an anode layer, a pixel definition layer disposed on the anode layer, and a cathode layer disposed on the pixel definition layer;
    an encapsulation layer disposed on the pixel layer; and
    a camera disposed on a side of the base layer away from the device layer;
    wherein a nanopore array is provided in a region of the anode layer corresponding to the camera, and the nanopore array is configured to allow external light to be transmitted to the camera through the anode layer to implement camera function of the camera.

2. The organic light-emitting diode display device according to claim 1, wherein an organic layer is disposed between the pixel layer and the device layer.

3. The organic light-emitting diode display device according to claim 2, wherein the anode layer is embedded in the organic layer.

4. The organic light-emitting diode display device according to claim 2, wherein a plurality of nanopores in the nanopore array are filled with a material of the organic layer.

5. The organic light-emitting diode display device according to claim 1, wherein a diameter of one of a plurality of nanopores in the nanopore array ranges from 10 to 200 nanometers.

6. The organic light-emitting diode display device according to claim 1, wherein a plurality of nanopores in the nanopore array are filled with a transparent material.

7. The organic light-emitting diode display device according to claim 1, wherein the pixel definition layer is provided with a plurality of openings, the openings are provided with a light-emitting layer comprising a plurality of pixel colors, and the nanopore array corresponding to the light-emitting layer allows light with a color other than the pixel color of the light-emitting layer to pass through.

8. The organic light-emitting diode display device according to claim 7, wherein a diameter of any one of a plurality of nanopores in the nanopore array corresponding to the light-emitting layer with a same pixel color is same.

9. The organic light-emitting diode display device according to claim 7, wherein a diameter of any one of a plurality of nanopores in the nanopore array corresponding to the light-emitting layer with a different pixel color is different.

10. The organic light-emitting diode display device according to claim 7, wherein the light-emitting layer comprises three pixel colors of red, green, and blue, the nanopore array corresponding to the light-emitting layer of the red pixel color allows green light and/or blue light to pass through, the nanopore array corresponding to the light-emitting layer of the green pixel color allows red light and/or blue light to pass through, and the nanopore array corresponding to the light-emitting layer of the blue pixel color allows red light and/or green light to pass through.

11. The organic light-emitting diode display device according to claim 1, wherein the pixel definition layer comprises a plurality of first pixel points, the camera comprises a plurality of second pixel points, one of the first pixel points and one of the corresponding second pixel points are respectively defined as a first vertical pixel point and a second vertical pixel point, and a pixel color of the first vertical pixel point is same as a pixel color of the second vertical pixel point.

12. The organic light-emitting diode display device according to claim 11, wherein an absolute value of a difference between a wavelength of light corresponding to the first vertical pixel point and a wavelength of light corresponding to the second vertical pixel point ranges from 30 nm to 60 nm.

13. The organic light-emitting diode display device according to claim 11, wherein the nanopore array corresponding to the second vertical pixel point allows light corresponding to the second vertical pixel point to pass through, but does not allow light corresponding to the first vertical pixel point to pass through.

14. The organic light-emitting diode display device according to claim 1, wherein the pixel definition layer comprises a plurality of first pixel points, the camera comprises a plurality of second pixel points, one of the first pixel points and one of the corresponding second pixel points are respectively defined as a first vertical pixel point and a second vertical pixel point, and a pixel color of the first vertical pixel point is different from a pixel color of the second vertical pixel point.

15. The organic light-emitting diode display device according to claim 14, wherein the nanopore array corresponding to the second vertical pixel point allows light with a same pixel color as the second vertical pixel point to pass through, but does not allow light with a same pixel color as the first vertical pixel point to pass through.

16. The organic light-emitting diode display device according to claim 1, wherein diameters of a plurality of nanopores in the nanopore array are not completely same, and the nanopores with different diameters transmit light with different colors.

17. The organic light-emitting diode display device according to claim 1, wherein a shape of a plurality of nanopores in the nanopore array is circular, oval, rectangular, diamond, or triangular.

18. The organic light-emitting diode display device according to claim 1, wherein the base layer is made of a flexible transparent material, and the device layer comprises an electronic component consisting of a plurality of thin film transistors and metal wires electrically connected to the thin film transistors.

19. The organic light-emitting diode display device according to claim 1, wherein the cathode layer and the encapsulation layer are both transparent structures, and a support pad is disposed between the pixel layer and the encapsulation layer.

20. An organic light-emitting diode display device, comprising:
   a base layer;
   a device layer disposed on the base layer;
   a pixel layer disposed on the device layer, wherein the pixel layer comprises an anode layer, a pixel definition layer disposed on the anode layer, and a cathode layer disposed on the pixel definition layer;
   an encapsulation layer disposed on the pixel layer; and
   a camera disposed on a side of the base layer away from the device layer;
   wherein a nanopore array is provided in a region of the anode layer corresponding to the camera, and the nanopore array is configured to allow external light to be transmitted to the camera through the anode layer to implement camera function of the camera;
   wherein a diameter of one of a plurality of nanopores in the nanopore array ranges from 10 to 200 nanometers;
   wherein the pixel definition layer is provided with a light-emitting layer comprising a plurality of pixel colors, and the nanopore array corresponding to the light-emitting layer allows light with a color other than the pixel color of the light-emitting layer to pass through; and
   wherein the diameter of any one of the nanopores in the nanopore array corresponding to the light-emitting layer with a same pixel color is same, and the diameter of any one of the nanopores in the nanopore array corresponding to the light-emitting layer with a different pixel color is different.

* * * * *